United States Patent
Usach Merino et al.

(10) Patent No.: US 11,515,882 B2
(45) Date of Patent: Nov. 29, 2022

(54) MCU MODE FOR SPI COMMUNICATION BETWEEN PRECISION CONVERTERS AND MICROCONTROLLERS

(71) Applicant: Analog Devices International Unlimited Company, Limerick (IE)

(72) Inventors: Miguel Usach Merino, Valencia (ES); Lluis Beltran Gil, Burjassot (ES)

(73) Assignee: Analog Devices International Unlimited Company, Limerick (IE)

( * ) Notice: Subject to any disclaimer, the term of this patent is extended or adjusted under 35 U.S.C. 154(b) by 69 days.

(21) Appl. No.: 17/127,211

(22) Filed: Dec. 18, 2020

(65) Prior Publication Data
US 2022/0200619 A1    Jun. 23, 2022

(51) Int. Cl.
H03M 1/12    (2006.01)
H03M 13/09    (2006.01)
H03M 9/00    (2006.01)

(52) U.S. Cl.
CPC ............ *H03M 1/12* (2013.01); *H03M 13/09* (2013.01); *H03M 1/1215* (2013.01); *H03M 9/00* (2013.01)

(58) Field of Classification Search
CPC ...... H03M 1/12; H03M 13/09; H03M 1/1215; H03M 9/00
See application file for complete search history.

(56) References Cited

U.S. PATENT DOCUMENTS

| | | | |
|---|---|---|---|
| 6,047,380 A | 4/2000 | Nolan et al. | |
| 7,498,962 B2 | 3/2009 | Alfano et al. | |
| 7,755,527 B2 | 7/2010 | Lee et al. | |
| 8,199,037 B2 | 6/2012 | Oak | |
| 9,203,665 B1 | 12/2015 | Haran | |
| 9,747,246 B2 | 8/2017 | Deng | |
| 9,817,636 B2 | 11/2017 | Wang | |
| 2007/0266716 A1* | 11/2007 | Klein | G01D 4/002 236/94 |
| 2020/0257352 A1 | 8/2020 | Hanson et al. | |

FOREIGN PATENT DOCUMENTS

CN    203399357 U    1/2014

OTHER PUBLICATIONS

"Leveraging ADC Technology to Capture, Compute and Communicate in Microcontroller-Based Embedded Systems", Silicon Laboratories, Inc., (2013), 5 pgs.

Ege, Y, et al., "Analog Data Transfer from Serial Port at Different Resolution", Balkan Physics Letters, 22, 221006, Bogazici University Press, pp. 60-69, (Jun. 15, 2014), 11 pgs.

(Continued)

*Primary Examiner* — Joseph J Lauture
(74) *Attorney, Agent, or Firm* — Schwegman Lundberg & Woessner, P.A.

(57) ABSTRACT

A data acquisition device comprises an analog-to-digital converter (ADC) circuit configured to produce a digital value from an analog input signal. The ADC circuit includes a signal input, a mode input, a serial output, and logic circuitry. The logic circuitry is configured to shift bits of the digital value out the serial output and change an order of the bits shifted out the serial output according to the mode input.

20 Claims, 13 Drawing Sheets

(56) References Cited

OTHER PUBLICATIONS

Gu, Enwei, et al., "Implementing SPI Communication Between MSP430™G2452 and LTC2382-16 ADC", [Online] Retrieved from the Internet: <URL: https://www.egr.msu.edu/classes/ece480/capstone/fall11/group07/file/Document_files/Application%20Note_EnweiGu.pdf>, (Nov. 12, 2011), 11 pgs.

Hendrick, Tom, "SPI-Based Data Acquisition/Monitor Using the TLC2551 Serial ADC", Texas Instruments Application Report, (Nov. 2001), 14 pgs.

Hendrick, Tom, "Using quad and octal ADCs in SPI mode", Texas Instruments, Inc., Analog Applications Journal 15-19, (Nov. 2000), 15-19.

Kugelstadt, Thomas, "A methodology of interfacing serial A-to-D converters to DSPs", Texas Instruments, Inc., Analog Applications Journal, (Feb. 2000), 10 pgs.

Tomecek, Jan, "The High-Performance Data Acquisition Circuit", Freescale Semiconductor, Inc. Application Note, (2015), 20 pgs.

Xie, Steven, "RAQ Issue 172: Manipulating MCU SPI Interface to Access a Nonstandard SPI ADC", AnalogDialogue, 53(4), Analog Devices, Inc., (Dec. 2019), 7 pgs.

\* cited by examiner

MCU MODE FOR SPI COMMUNICATION BETWEEN PRECISION CONVERTERS AND MICROCONTROLLERS

BACKGROUND

Data acquisition systems can be used for remote monitoring of electronic systems. Analog signals from sensors can be quantified and the quantified signals can be analyzed using a computing system that makes decisions on the operation of the monitored system. However, the device that quantifies the analog signal may not produce the quantized values in a format of the microcontroller that is used to analyze the quantization. This can lead to inefficiencies in the data acquisition system.

OVERVIEW

This document relates generally to data acquisition systems and in particular to improving inefficiencies of data acquisition systems that include a microcontroller. An example data acquisition device includes an analog-to-digital converter (ADC) circuit configured to produce a digital value from an analog input signal. The ADC circuit includes a signal input, a mode input, a serial output, and logic circuitry. The logic circuitry is configured to shift bits of the digital value out the serial output and change an order of the bits shifted out the serial output according to the mode input.

An example method of processing an analog signal includes producing a digital value from the analog signal using an ADC circuit, shifting bits of the digital value out a serial output of the ADC circuit, and setting, according to a mode input of the ADC circuit, an order that the bits of the digital value are shifted out the serial output of the ADC circuit.

An example data acquisition system includes an ADC circuit configured to produce a digital value from an analog input signal and a microcontroller. The ADC circuit includes a signal input, a mode input, a serial output, and logic circuitry. The logic circuitry is configured to shift bits of the digital value out the serial output and change an order of the bits shifted out the serial output according to the mode input. The microcontroller includes a serial interface coupled to the serial output of the ADC circuit; and a control output coupled to the mode input of the ADC circuit. The microcontroller is configured to select the order of bits of the digital value shifted out the serial output of the ADC circuit using the control output.

This section is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
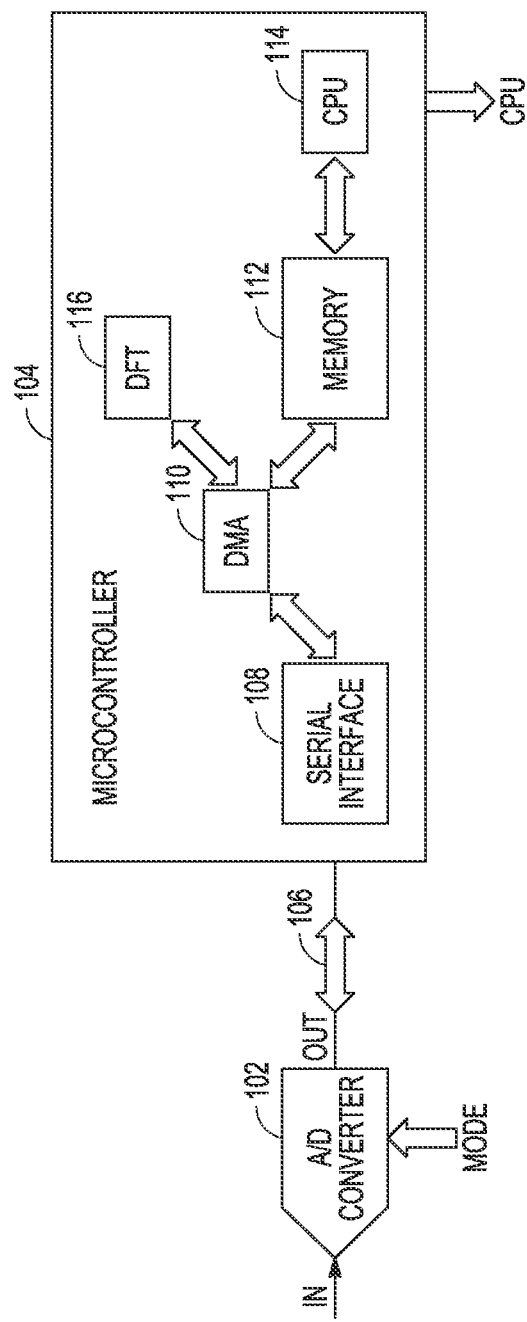
FIG. 1 is a block diagram of an example of portions of a data acquisition system.

Data acquisition systems can include a quantizing device that quantizes an analog signal to digital values and a computing device to analyze the quantization to make decisions about the monitored system. FIG. 1 is a block diagram of an example of a data acquisition system. The system includes an analog-to-digital converter (ADC) circuit 102 as the quantizing device and a microcontroller 104 or micro controller unit (MCU) as the computing device. Data is transferred between the ADC circuit 102 and the microcontroller 104 using a serial peripheral interface (SPI) 106. Microcontrollers do not provide flexibility for customizing functional blocks, especially serial interface blocks 108, as would be possible using a customizable device such as a field programmable gate array (FPGA) for example. In addition, designers of precision ADCs tend to optimize the way the data bits are transferred between the ADC and the MCU.

Optimizing the data transfer between the ADC and the computing device provides several advantages. It achieves maximum throughput rates and minimizes the data transfer time. This allows more time for conversion operations by the ADC and allows more data to be transferred in a given amount of time. It reduces the minimum serial clock frequency needed to transfer the data. It also minimizes the number of data output pins and reduces the output driver size.

An issue with optimizing the data transfer between an ADC and a microcontroller is that the device blocks used to transfer data are not customizable. For example, for a 32-bit MCU, the number of bits that can be transferred in a single transaction over an SPI is selectable between 8, 16, or 32-bits, and internal register of the MCU are 32-bits wide. In contrast, a fully flexible FPGA allows the register width and the number of bits transferred per SPI transaction to be customizable.

In addition, a microcontroller 104 may include a specific block, such as a direct memory access (DMA) controller 110, to manage the internal data transactions between the SPI 106 and the memory 112 so that the processor 114 of the microcontroller is not interrupted. Using DMA for memory transfer reduces the overall power consumption, as well as increase algorithm efficiency, as DMA controls the serial transactions between the ADC, and the SPI block and memory of the microcontroller. The DMA controller 110 can be configured as a multiple of eight bits (e.g., 8, 16, 32 bits) for a transaction byte, half word or word between the SPI 106 and the memory 112.

Precision ADCs optimize data communication and transactions so that the amount of data transferred is minimized. This provides the benefits discussed previously herein. If the required number of bits, to be transferred matches the configuration of the serial interface of the microcontroller, the data transfer is efficient. For example, if the ADC is a 16-bit ADC circuit, and the serial interface block of the microcontroller natively supports this width (e.g., by 8-bit or 16-bit data transmission frames), the communication can be straightforward. The serial interface block will be configured to generate transactions of 16-bits or 2×8-bits. The DMA can be configured in such a way that every 16-bit data frame is stored in a different memory location. The processor 114 will later access the different memory locations to operate on the data, or the DMA may be configured to automatically forward the data frames to a different hardware block, such as a discrete Fourier transform (DFT) engine 116 for example.

A difficulty occurs when the number of bits to be transmitted by the ADC interface is not exactly the number of bits that are supported by serial interface 108 and the DMA 110. Typically, the DMA can only "take" an even multiple of a byte (8-bits), half-word (16-bits), or a word (32-bits) from the serial interface block 108. If the number of conversion bits produced by the ADC circuit is not an even multiple of 8, 16 or 32, the transfer of data can be inefficient.

Figure 2:
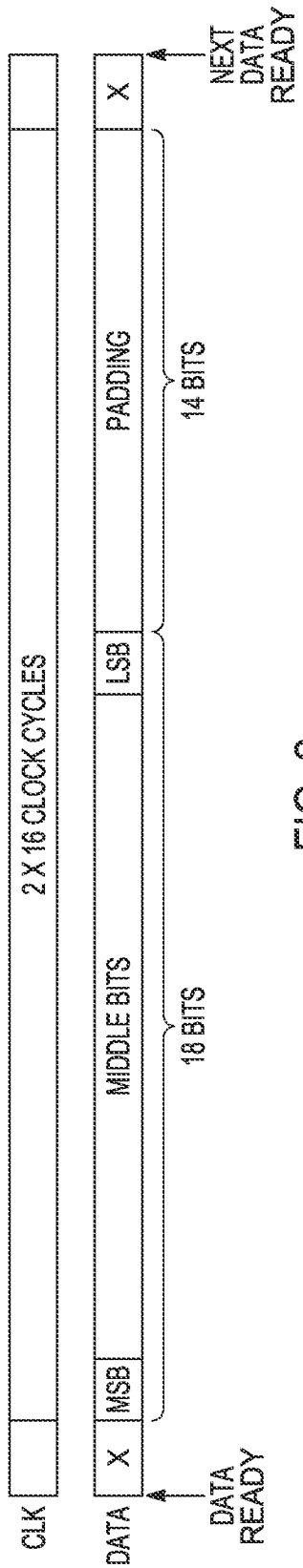
FIG. 2 is an illustration of an example of a data frame transferred serially from an analog-to-digital converter (ADC) in a normal mode using the data acquisition system of FIG. 1.

FIG. 2 is an illustration of an example of a 32-bits being transferred serially in two 16-bit frames using a serial interface such as the SPI 106 of FIG. 1 for example. The 32 bits of data could also be transferred as one 32-bit frame. The data frames include 18 bits of conversion data produced by an 18-bit ADC circuit. The 32-bits of data are shifted out over 32 clock cycles starting with the most significant bit (MSB) of the conversion data and ending with the least significant bit (LSB). The illustration shows that padding data don't care data) is included in the data frame after the LSB. The padding data added may be dependent on the ADC design.

Figure 3:
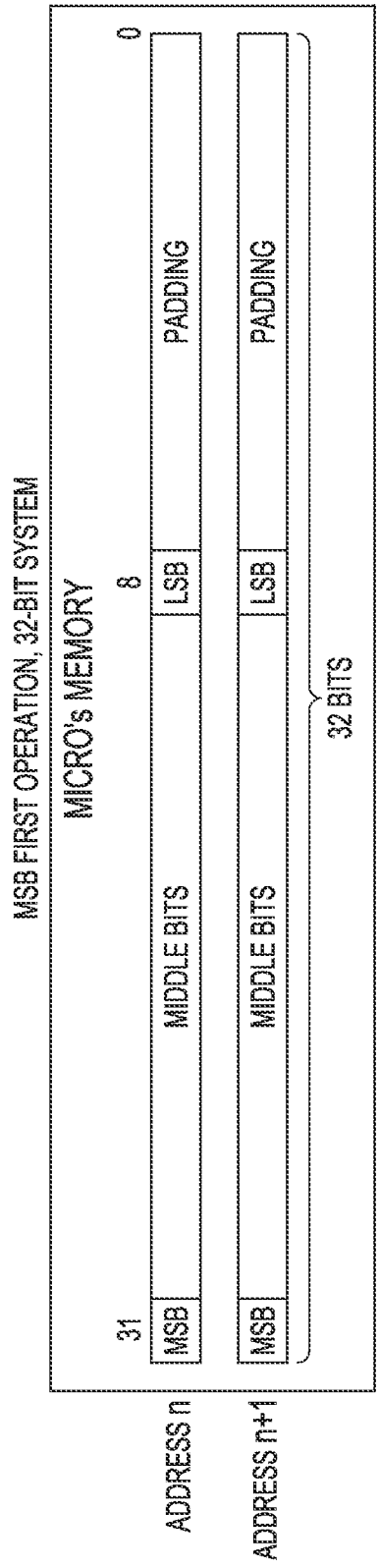
FIG. 3 is an illustration of memory locations storing the serial data transferred in FIG.

FIG. 3 is an illustration of consecutive 32-bit memory locations with serial data stored in the locations. The data is stored as the data was received. The padding data changes the data value, and the processing block of the microcontroller needs to perform operations on the received data before it can be analyzed in order to make valid decisions about the system being monitored. For example, the CPU may have to reformat the data to right justify the data in one or more memory locations and may have to remove the padding data. This adds time and required power to the monitoring process. The microcontroller wastes time and power doing these operations, and this reformatting can be a recurrent routine operation that must be performed at the software level. In addition, the received data cannot be processed internally by other blocks (e.g., a DFT engine) directly. The microcontroller may interrupt an algorithm (e.g., a DFT algorithm) to perform the data manipulation so the data can be processed by the other blocks. In some cases, the microcontroller must be awake to attend to the operations for memory access and data manipulation, which consumes power and time.

Figure 4:
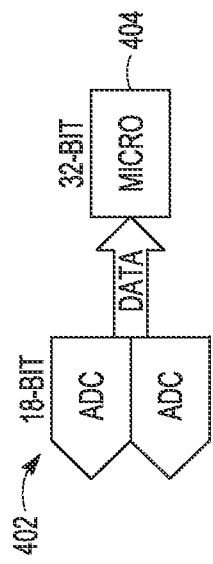
FIG. 4 is a block diagram of an example of a data acquisition system that includes a multi-channel ADC.

FIG. 4 is a block diagram of an example of a data acquisition system that includes a multi-channel ADC circuit 420. Only a two-channel ADC circuit is shown for simplicity, but the multi-channel ADC circuit 420 may include more than two channels. Each channel shifts out an 18-bit analog-to-digital (A/D) conversion data value out the serial interface.

Figure 5:
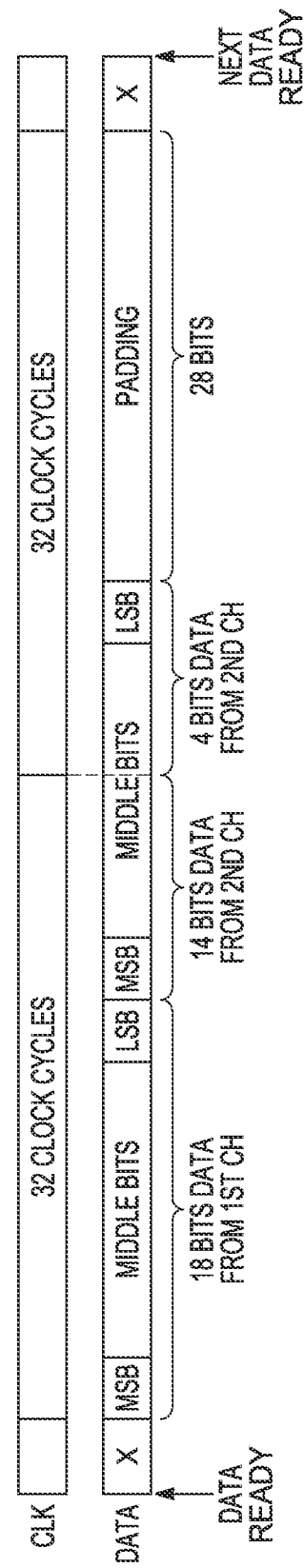
FIG. 5 is an illustration of an example of data frames transferred serially using the data acquisition system of FIG. 4.

FIG. 5 is an illustration of a two 32-bit data frames being shifted out serially by the multi-channel ADC circuit starting with the MSB of the first channel and ending with the LSB of the second channel. Because each channel is 18 bits, the data values do not fit evenly into a 32-bit frame and two data frames are used. The second data frame includes a portion of the second A/D conversion value and the remainder of the second data frame includes padding data.

Figure 6:
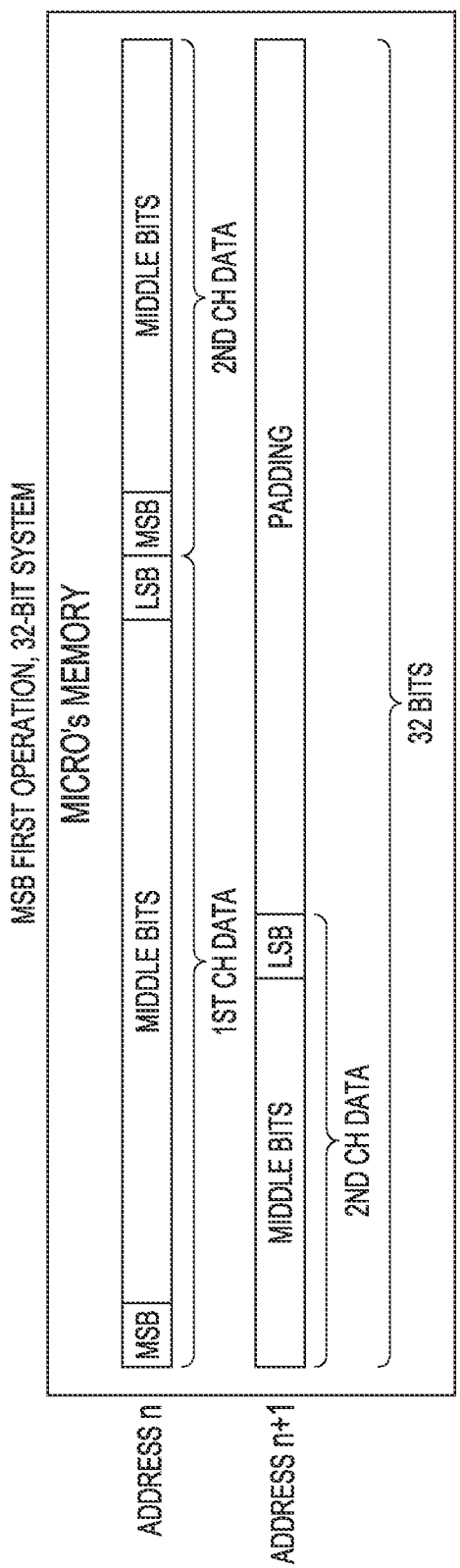
FIG. 6 is an illustration of memory locations storing the serial data transferred in FIG. 5.

FIG. 6 is an illustration of two consecutive 32-bit memory locations with the serial data from the two channels stored in the memory locations. The data is stored as the data was received. As with the example of FIG. 3, the digital values are changed and the processor of the MCU may have to reformat the data to recover and use the digital values. For example, the processor may right justify the data in one or more memory locations and may remove the padding data. This adds time and required power to the monitoring process. This issue also occurs in the case that the LSB is shifted out first and the MSB last.

Figure 7:
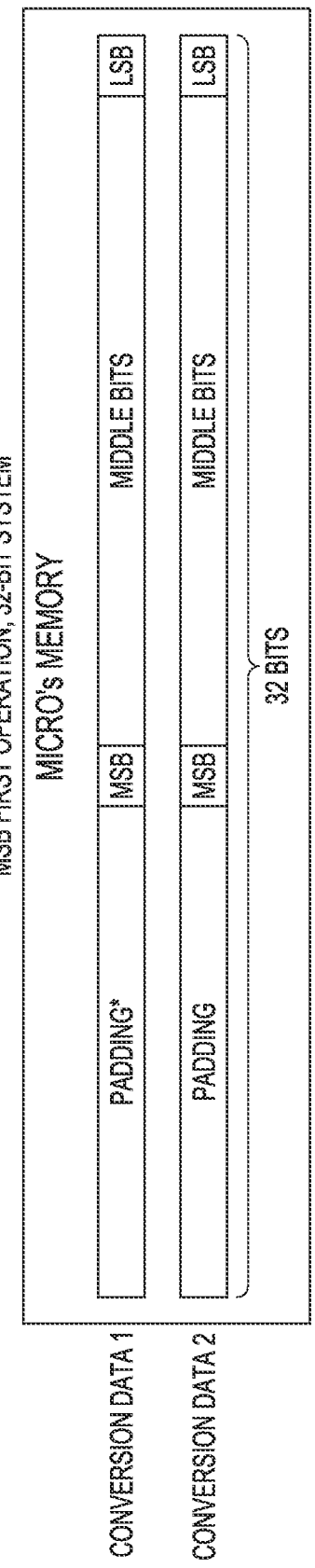
FIG. 7 is an illustration of the serial data of FIG. 5 stored in the desired format in memory.

FIG. 7 is an illustration of the two 18-bit A/D conversion values stored in the desired format in memory. The two 18-bit data conversion values are right justified in memory. This retains the value of the A/D conversion and is easy for the CPU to perform binary arithmetic on the values. It is desirable for a data acquisition system to work efficiently with an MCU.

Figure 8:
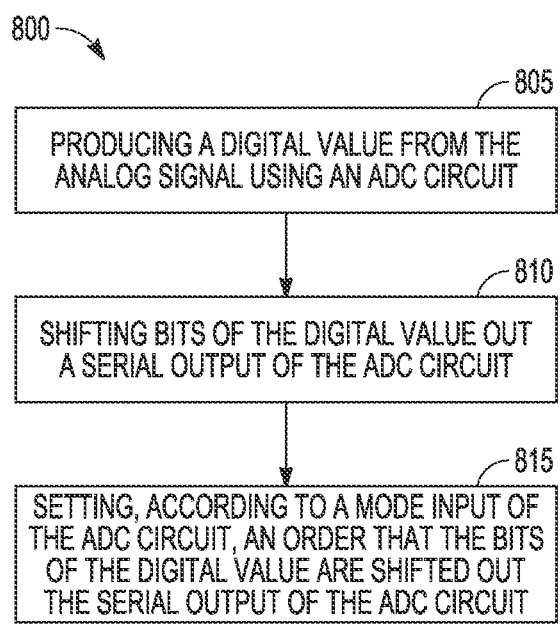
FIG. 8 is a flow diagram of an example of a method of processing an analog signal.

FIG. 8 is a flow diagram of an example of a method 800 of processing an analog signal. At 805, a digital value is produced from the analog signal using ADC circuit. At 810, the ADC circuit shifts the bits of the digital value out the serial output of the ADC circuit. The ADC circuit 102 of FIG. 1 includes logic circuitry to transfer A/D conversion results as digital values out the serial output of the ADC circuit. As shown in FIG. 1, the ADC circuit 102 has a mode input (MODE). The mode input changes the way the A/D conversion data value is shifted out the serial output. At 815, the order that the bits of the digital value are shifted out the serial output is changed according to the mode input of the ADC circuit. The modes of the shifting include a non-MCU mode and an MCU mode. When set to the MCU mode, the logic circuitry shifts out the bits of the digital values in an order compatible with the serial interface format for the MCU. This minimizes the data manipulation needed when the ADC circuit serially shifts the A/D conversion digital data to the MCU 104; thereby improving efficiency of the MCU.

The mode input can be hard-coded, such as by setting a voltage on the mode pin (or pins) of the ADC circuit. In some aspects, the MCU 104 includes a control output CONTROL. The control output of the MCU 104 can be coupled to the mode input of the ADC circuit 102 and the coupled to the mode input of the ADC circuit, wherein the microcontroller is configured to select the order of bits of the digital value shifted out the serial output of the ADC circuit using the control output.

Figure 9:
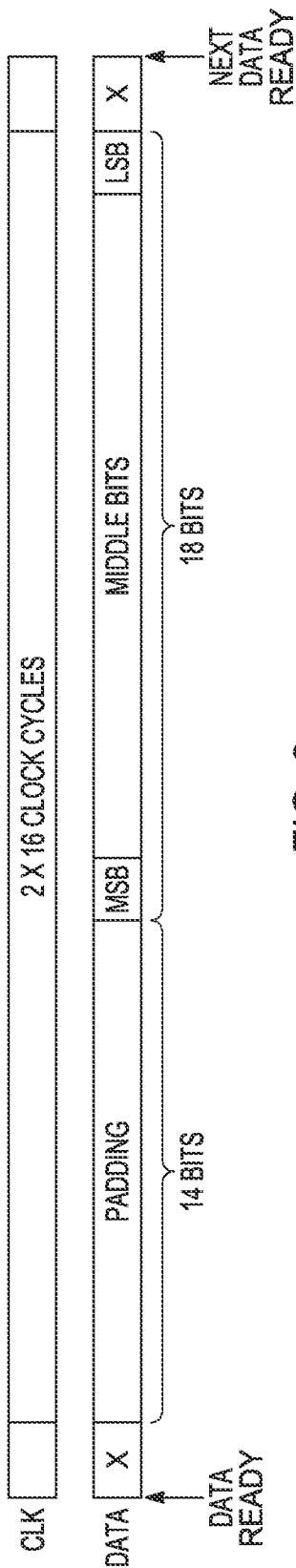
FIG. 9 is an illustration of an example of a data frame shifted out by an ADCC most significant bit (MSB) first in a microcontroller unit (MCU) mode.

FIG. 9 is an illustration of an example of 32 bits of data shifted out by the ADC circuit 102 when the MCU mode is selected using the mode input. In the example of FIG. 9, the 32-bits of data are shifted out in two 16-bit data frames and the AD conversion value is an 18-bit digital value. The other 14 bits of the data frame are filled with padding data. In some aspects, the bits of the padding data are set to zeros. The padding data can be sign extension data (e.g., the padding data is the same as the MSB). This accommodates the two's complement binary data format, Note that the digital value is right justified in the data frame and the bits of the data frame in the illustration are shifted out from left to right in the illustration. The padding data is shifted out first followed by the digital value starting with the MSB of the digital value.

A comparison with the desired memory storage format shown in FIG. 7 shows that the data format of the MCU mode reduces the need for the processor of the MCU (or if present, the DMA controller of the MCU) to manipulate data to achieve the desired memory storage format. When the MCU mode is not selected, the digital values may be shifted out by the logic circuitry of the ADC circuit 802 in an 18-bit data frame starting with MSB. The 18-bit format may be used for an FPGA mode for example.

Figure 10:
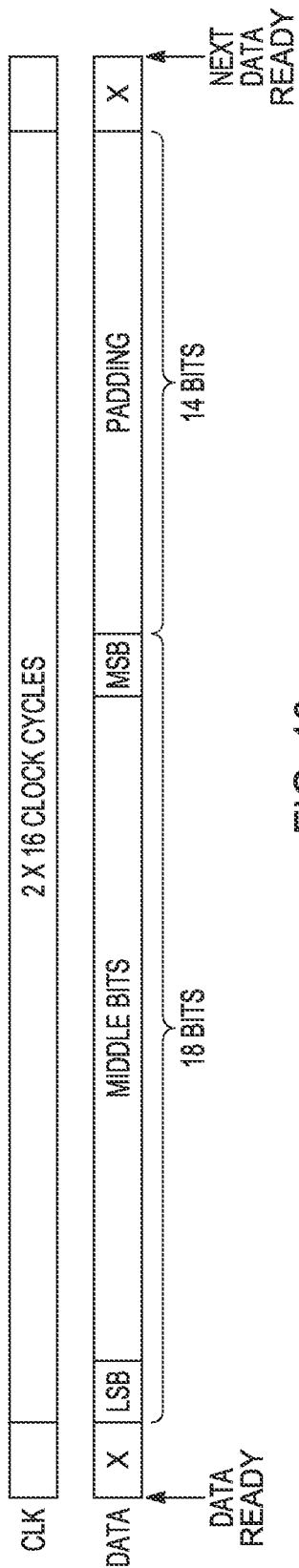
FIG. 10 is an illustration of an example of a data frame shifted out by an ADC least significant bit (LSB) first in the MCU mode.

FIG. 10 is an illustration of another example of data frames shifted out by the ADC circuit 102 when the MCU mode is selected. As in the example of FIG. 9, the data frames are 16-bit data frames and the A/D conversion value is an 18-bit digital value. The difference is that the bits of the A/D conversion data are shifted out in the reverse order from FIG. 9. The LSB of the digital value is shifted out first and the padding data follows the MSB of the digital value. As in the example of FIG. 9, in the example of FIG. 10 the padding data may be sign extension data. The mode input may have multiple inputs (e.g., multiple pins) to select from more than two modes. For example, the mode input can be used to select shifting out bits from the ADC circuit in the normal output of FIG. 2, the MSB first format of FIG. 9, or the LSB first format of FIG. 10.

Figure 11:
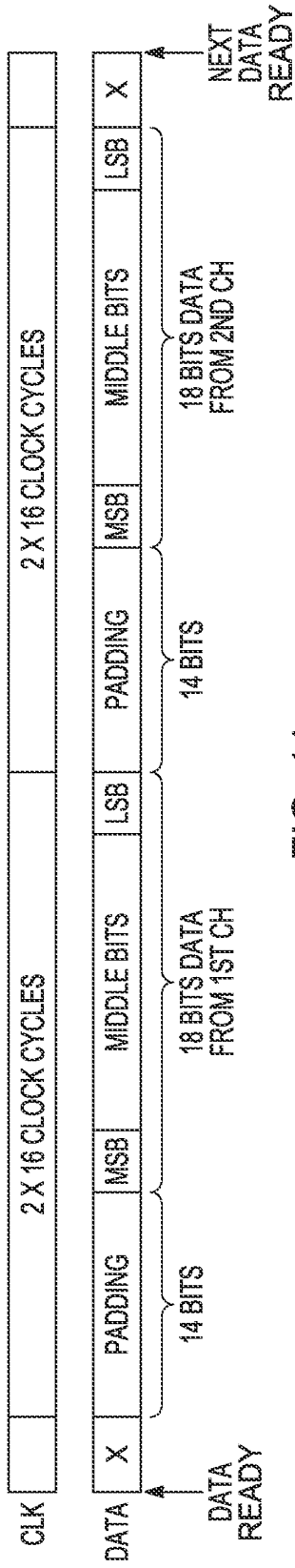
FIG. 11 is an illustration of an example of data frames shifted out most significant bit (MSB) first by a multi-channel ADC circuit in the MCU mode.

FIG. 11 is an illustration of an example of four data frames shifted out by a multi-channel ADC circuit in the MCU mode. In the example of FIG. 11, there are two channels and each channel produces an 18-bit A/D conversion value. Each 18-bit digital value is shifted out in two 16-bit data frames. Each data frame has the format of the example of FIG. 9 and the data frames are concatenated. The bits of each data frame are shifted out starting with the padding data first followed by the digital value of the data frame starting with the MSB. Only two data frames are shown in FIG. 11 for the case where the multi-channel ADC circuit has two channels. The multi-channel ADC circuit may have more than two channels and the data frames for the channels are shifted out one after another.

Figure 12:
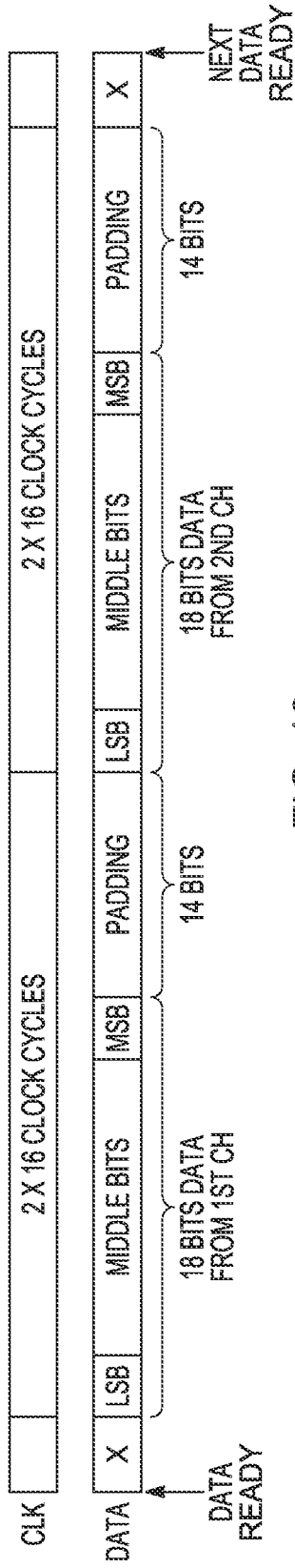
FIG. 12 is an illustration of an example of data frames shifted out least significant hit (LSB) first by a multi-channel ABC circuit in the MCI) mode.

FIG. 12 is an illustration of another example of four data frames shifted out by a multi-channel ADC circuit in the MCU mode. As in the example of FIG. 11, there are two channels and each channel produces an 18-bit A/D conversion value. Each 18-bit digital value is shifted out in two-bit data frames. Each data frame has the format of the one channel example of FIG. 10. The bits of each data frame are shifted out starting with the bits of the digital value first starting with the LSB followed by the padding data. As in the examples of FIGS. 9 and 10, in the examples of FIGS. 11 and 12, the padding data may be sign extension data.

Figure 13:
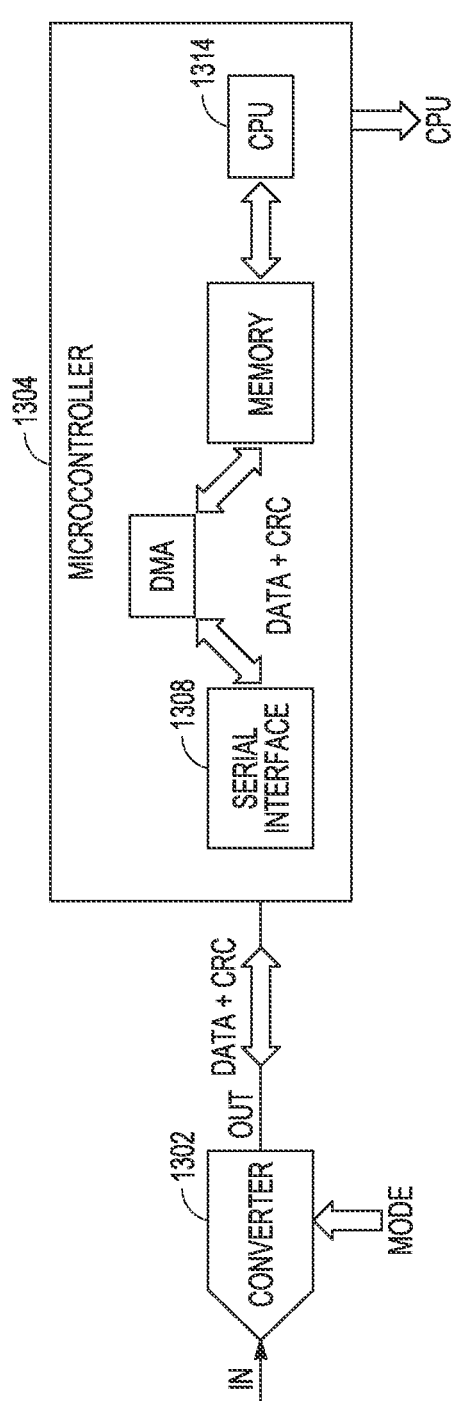
FIG. 13 is a block diagram of an example of a data acquisition system that provides cyclic redundancy code (CRC) data with the ADC data.

FIG. 13 is a block diagram of another example of a data acquisition system 1300. The system includes ADC circuit 1302 and an MCU 1304. The ADC circuit 1302 also includes cyclic redundancy code (CRC) circuitry that calculates a CRC over the data being sent to the MCU 1304 and the ADC circuit 1302 sends the CRC data to the serial interface 1308 of the MCU 1304.

Figure 14:
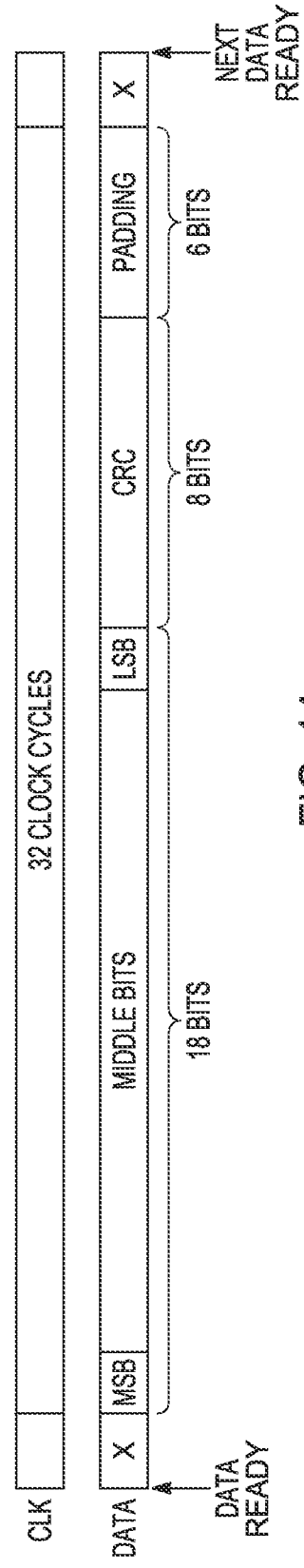
FIG. 14 is an illustration of an example of a data frame with cyclic redundancy code (CRC) shifted out by the ADC of FIG. 13 when the MCU mode is not selected.
Figure 15:
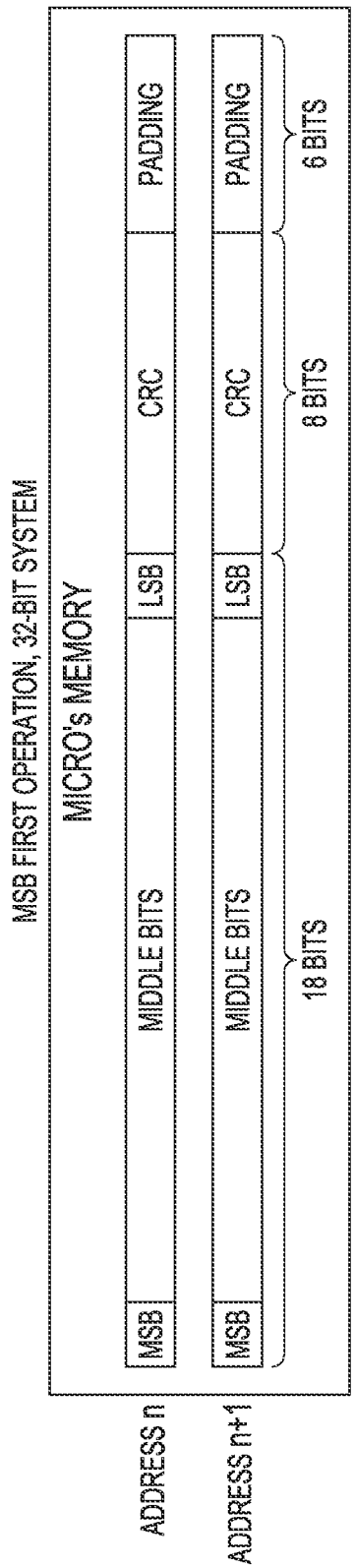
FIG. 15 is an illustration of an example of serial data and CRC data stored in the MCU memory when the data is transferred using the format of FIG. 14.

FIG. 14 is an illustration of an example of a data frame shifted out by the ADC circuit 1302 when the MCU mode is not selected and the ADC circuit 1302 sends CRC data. The data frame is a 32-bit data frame that includes the 18-bit digital value starting with the MSB and followed by the CRC data. The CRC data includes 8 bits and 6 bits of Padding data is appended to the CRC data to fill the 32-bit frame. FIG. 15 is an illustration of an example of the digital value and CRC stored in the MCU memory when the data is shifted to the MCU in the format of FIG. 14. The CRC for the digital conversion value and the padding data are stored with the digital conversion value. The CRC and the padding data change the data value stored from the digital conversion value, and the processor of the MCU needs to process the stored data to determine the digital conversion value. This is inefficient in terms of time and power. This is also the case if the LSB is shifted out first followed by the CRC data and padding data.

Figure 16:
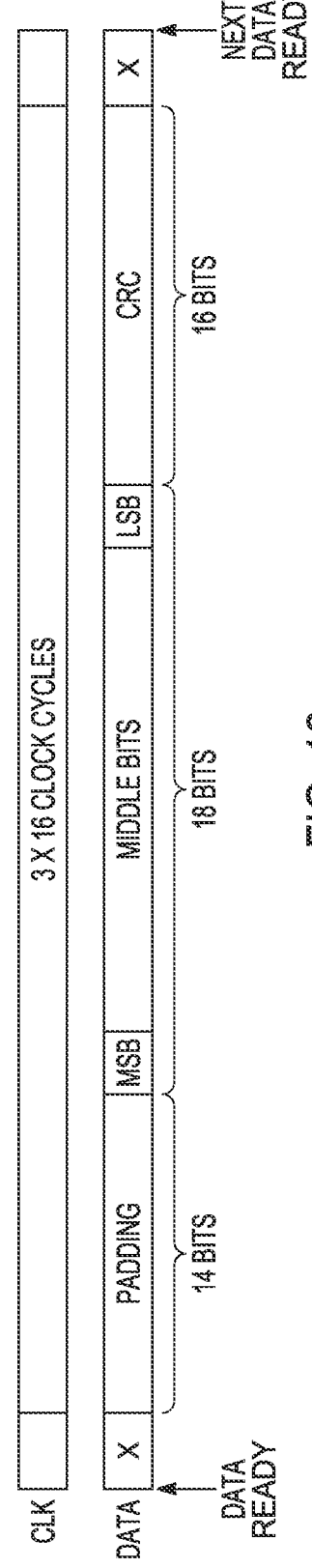
FIG. 16 is an illustration of an example of a data frame shifted out by the ADC of FIG. 13 when MCU mode is selected.

FIG. 16 is an illustration of an example of a data frame shifted out by the ADC circuit 1302 of FIG. 13 when the MCU mode is selected and the ADC circuit 1302 sends CRC data. The data frame is a 48-bit data frame (3×16 bits) that includes the 18-bit digital value starting with the MSB and followed by 16 bits of CRC data. Fourteen bits of padding data is added to fill the 48-bit frame as in the example of FIG. 14, but the padding data is shifted out first before the digital value.

Figure 17:
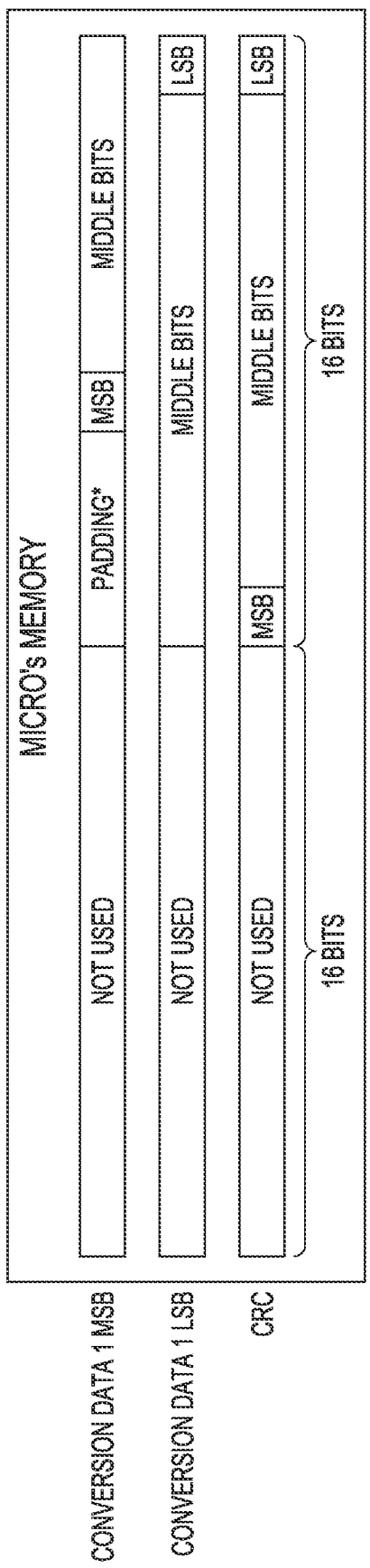
FIG. 17 is an illustration of an example of serial data and CRC stored in three consecutive memory locations of the MCU memory when the data is shifted out by the ADC of FIG. 13 when MCU mode is selected.

FIG. 17 is an illustration of an example of the digital value and CRC stored in three consecutive memory locations of the MCU memory when the data is shifted to the MCU in the format of FIG. 16. The storing may be performed by a DMA controller of the MCU or by a processor of the MCU. The CRC data, the 18-bit digital value, and the padding data are stored as three 16-bit words with the CRC data stored separately from the 18-bit digital conversion data and 14 bits of padding data. The padding data may be all zeros to form a 32-bit unsigned binary number with the digital conversion data, or the padding data may be the MSB for two's complement binary data. The processor 1314 of the MCU performs less data manipulation than in the example of FIG. 15 leading to a more efficient process.

Figure 18:
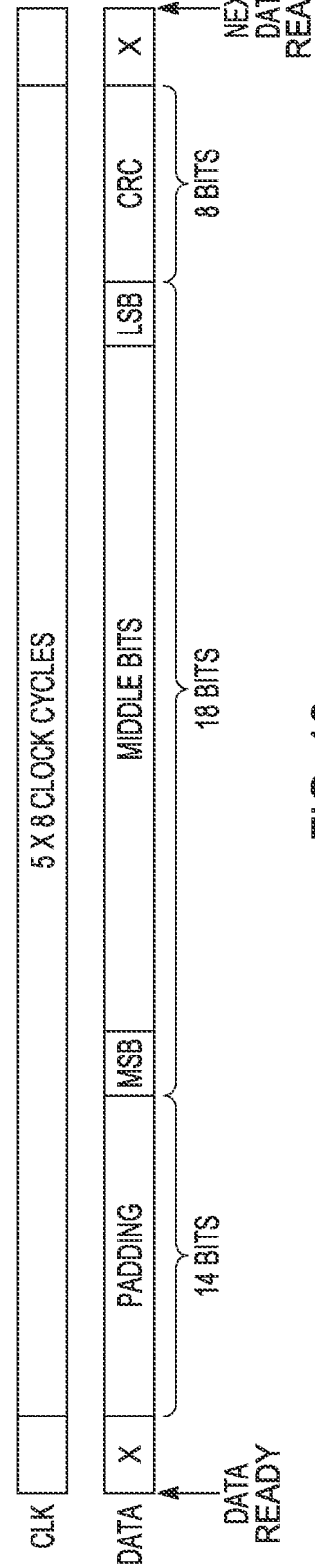
FIG. 18 is an illustration of an example of a data frame shifted out by the ADC of FIG. 13 when MCU mode is selected.

FIG. 18 is an illustration of an example of a data frame shifted out by the ADC circuit 1302 of FIG. 13 when the MCU mode is selected and the ADC circuit 1302 sends CRC data. The example is an option to the transfer of example 16 if the SPI 106 is configured for 8-bit transfer. The data frame is a 40-bit data frame (5×8 bits) that includes the 18-bit digital value starting with the MSB and followed by 8 bits of CRC data. Fourteen bits of padding data is added to fill the 40-bit frame as in the example of FIG. 14, but the padding data is shifted out first before the digital value.

The mode input of the ADC circuit 1302 may have multiple inputs (e.g., multiple pins) to select from multiple modes. For example, the mode input can be used to select shifting out bits from the ADC circuit in a non-MCU mode, a non-MCU mode with CRC, an MCU mode with an MSB first format, an MCU mode with an LSB first format, and an MCU mode with CRC and MSB first, and an MCU mode with CRC and LSB first.

Figure 19:
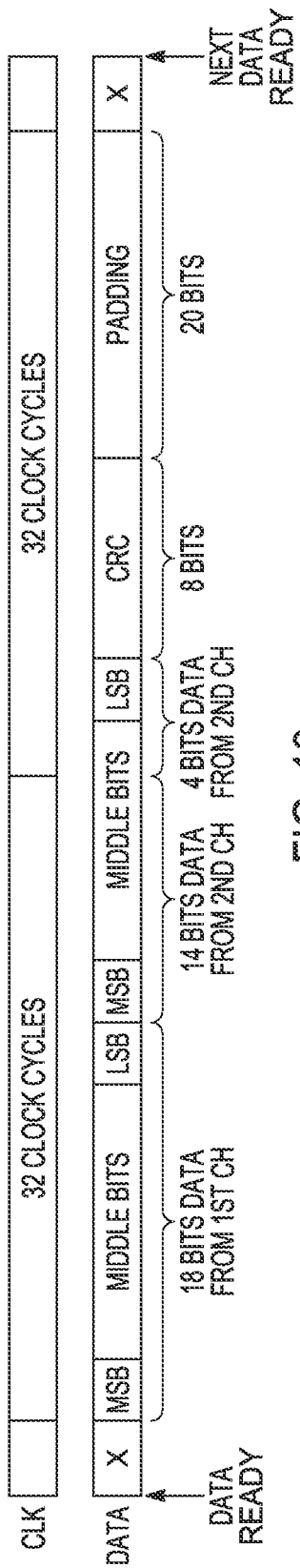
FIG. 19 is an illustration of an example of two data frames with CRC shifted out by a multi-channel ADC when the MCU mode is not selected.

FIG. 19 is an illustration of an example of two data frames with CRC data shifted out by a multi-channel ADC circuit when the MCU mode is not selected. The example shown in FIG. 18 is for a two-channel ADC circuit with CRC, but the concepts can be applied to multi-channels ADCs with more than two channels. The data frames are each 32-bit data frames and each digital conversion value is 18-bits. Eight bits of CRC data is calculated over both of the digital values and is appended to the end of the second digital value. Padding data (20 bits) is appended to the CRC data to fill the second 32-bit data frame. Because each channel is 18 bits, the data values do not fit evenly into one 32-bit frame and the second digital value is split between the two data frames. The example in FIG. 18 shows the MSBs of the digital values is shifted out first, but alternatively the LSBs could be shifted out first.

Figure 20:
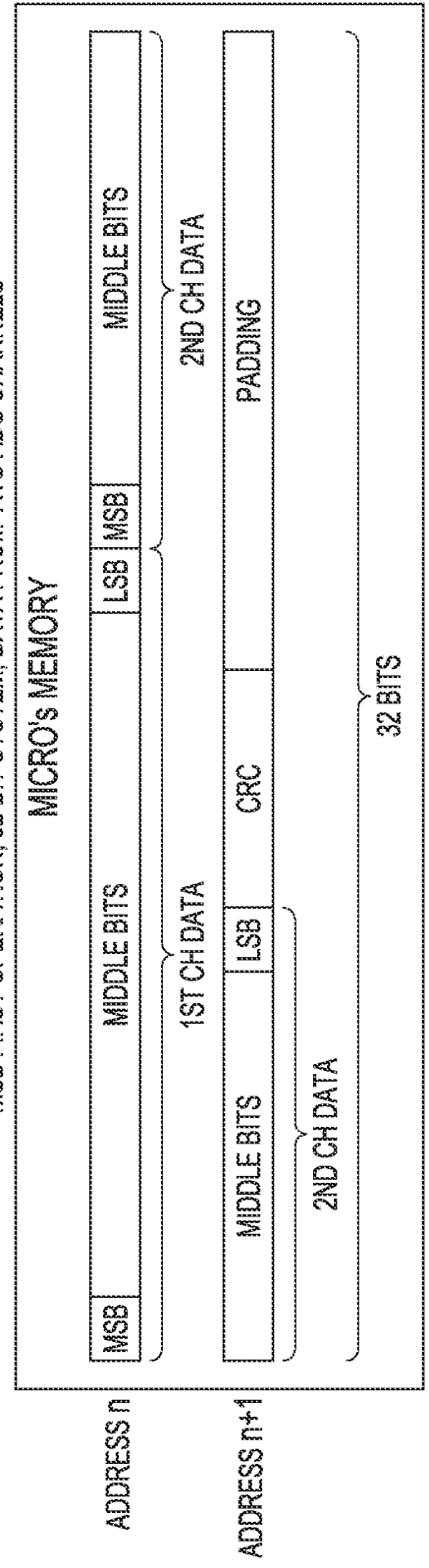
FIG. 20 is an illustration of memory locations storing the serial data shifted using a multi-channel ADC when the MCU mode is not selected.

FIG. 20 is an illustration of two consecutive 32-bit memory locations with the serial data from the two channels and the CRC data stored in the memory locations. The data is stored as the data was received. The digital conversion data is changed and the processor of the MCU may have to reformat the data to recover and use the digital values. As with the other non-MCU modes described herein, this adds time and required power to the monitoring process.

Figure 21:
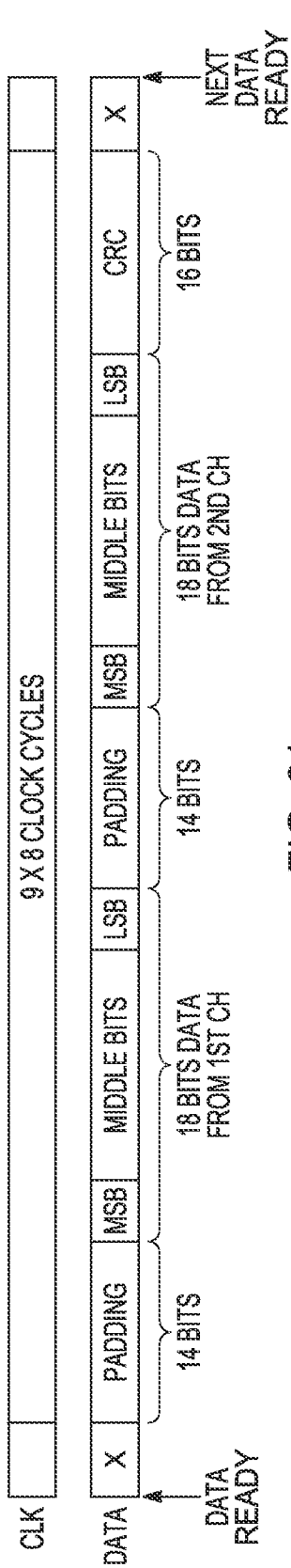
FIG. 21 is an illustration of an example of a data frame with CRC shifted out by a multi-channel ADC when the MCU mode is selected.
Figure 22:
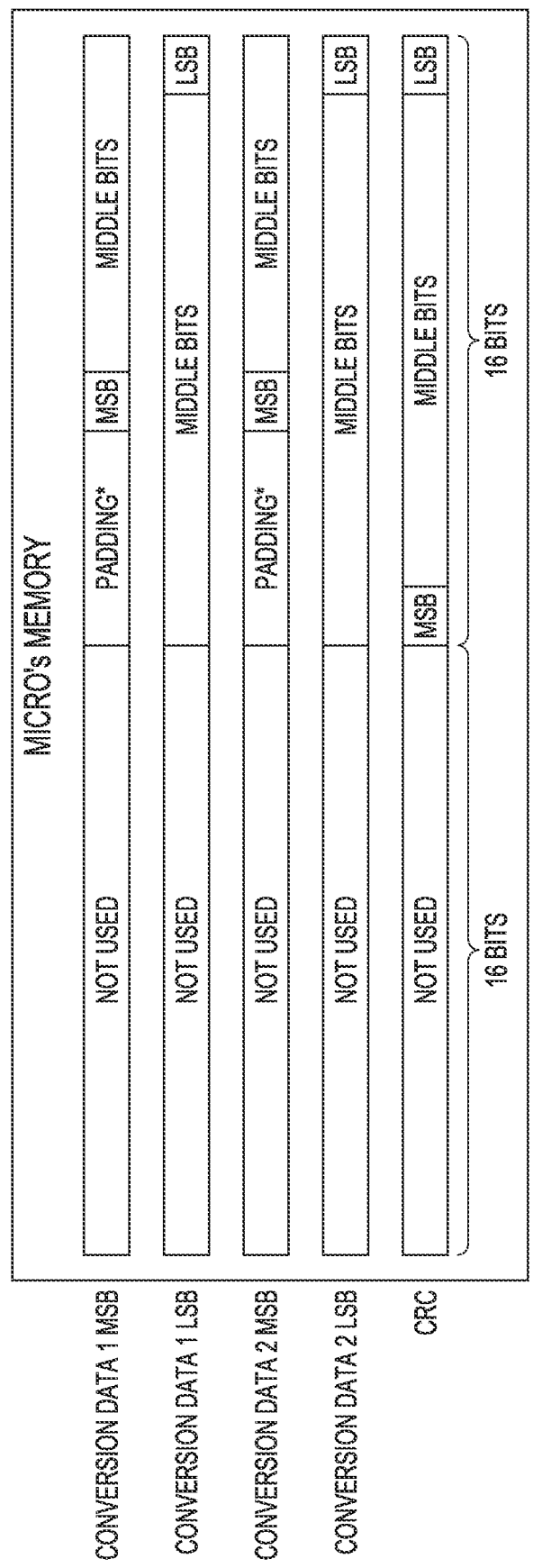
FIG. 22 is an illustration of memory locations storing the serial data and CRC transferred using the format of FIG. 21 when the MCU mode is selected.

FIG. 21 is an illustration of an example of data frames with CRC data shifted out by a multi-channel ADC circuit when the MCU mode is selected. In contrast to the non-MCU mode of FIG. 19, the data frame is 72 bits (9×8 bits). The CRC data is 8 bits and is calculated over the digital conversion values. If 16 bits of CRC are sent, five data frames of 16-bits can be used. The padding data (14 bits) is positioned before each 18-bit digital conversion value and the CRC data is appended to the end of the second digital value. FIG. 22 is an illustration of five consecutive memory locations storing 16 bits of CRC data and the two digital conversion values. The format of the stored data in FIG. 22 follows the format of the one channel example of FIG. 17 with the digital values and the CRC data stored in different memory locations. The digital values are stored as four 16-bit words that can be handled easily by the processor of the MCU. The example in FIGS. 21 and 22 show the MSB being shifted out first, but alternatively the LSBs of the digital values can be shifted out first.

Figure 23:
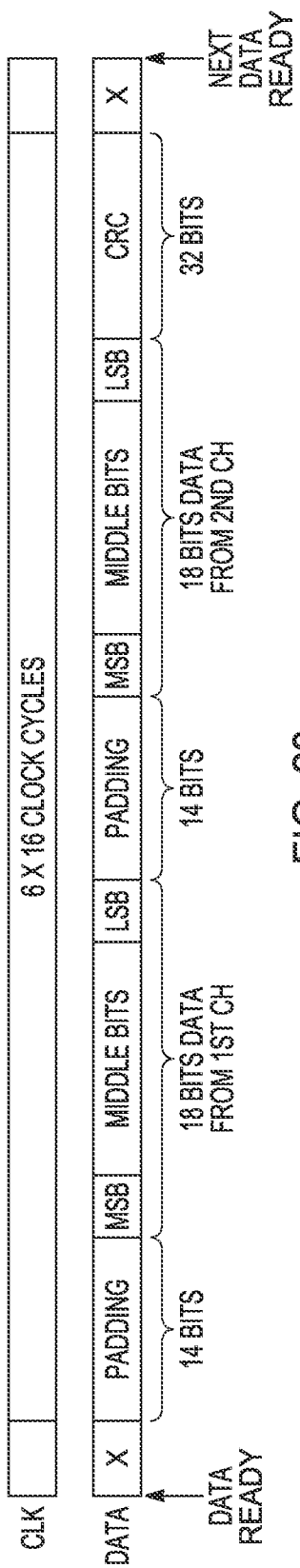
FIG. 23 is an illustration of another example of a data frame with CRC shifted out by a multi-channel ADC when the MCU mode is selected.
Figure 24:
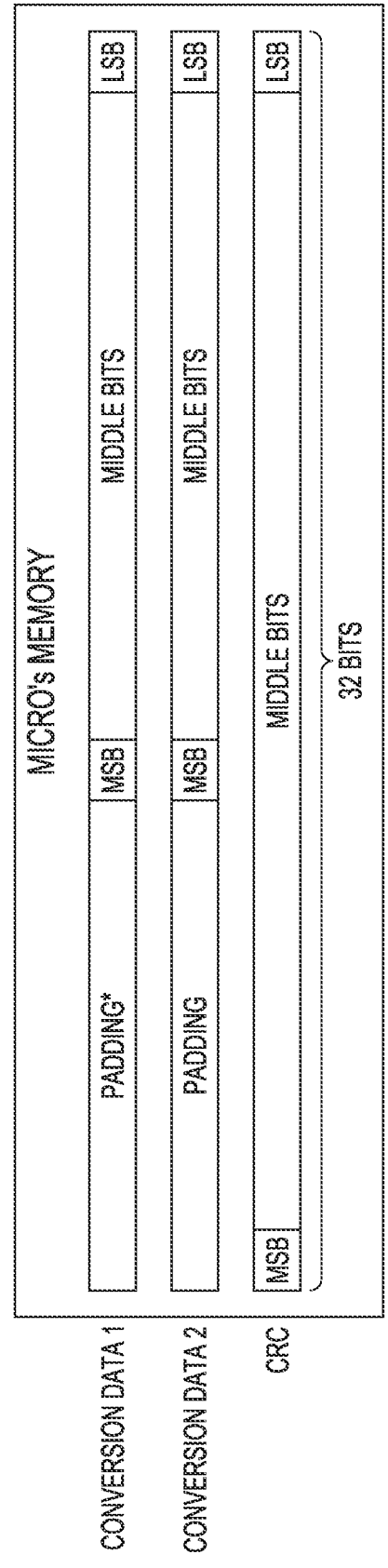
FIG. 24 is an illustration of memory locations storing the serial data and CRC transferred using the format of FIG. 23 when the MCU mode is selected.

FIG. 23 is an illustration of another example of a data frame with CRC data shifted out by a multi-channel ADC circuit when the Mal mode is selected. In the example of FIG. 23, 32 bits of CRC data are calculated over the two digital conversion values and the data frame is 96 bits (6×16 bits). The padding data (14 bits) is positioned before each of the 18-bit digital conversion values. The 32-bit CRC data is calculated over the two 18-bit digital conversion values and is appended to the second digital value. FIG. 24 is an illustration of the digital values and CRC data stored in three consecutive memory locations. The digital values are stored as two 32-bit words that can be handled easily by the processor of the MCU. Not that while more data bits (96) were shifted out than in the example of FIG. 20 (80 bits), the data shifted out in the 96-bit example is stored in less memory locations.

The devices, methods, and systems described herein can provide improved efficiency for data acquisition by selectively formatting the bits sent serially by an ADC circuit. The format of the serial output or serial port is optimized to improve efficiency of the tasks performed using the computing device.

ADDITIONAL DESCRIPTION AND ASPECTS

A first Aspect (Aspect 1) includes subject matter (such as a data acquisition device) comprising an analog-to-digital converter (ADC) circuit configured to produce a digital value from an analog input signal. The ADC circuit includes a signal input, a mode input, a serial output, and logic circuitry. The logic circuitry is configured to shift bits of the digital value out the serial output, and change an order of the bits shifted out the serial output according to the mode input.

In Aspect 2, the subject matter of Aspect 1 optionally includes logic circuitry configured to, when selected according to the mode input, shift the bits of the digital value in a data frame that includes padding data first followed by the bits of the digital value starting with the most significant bit of the digital value, wherein the digital value is right justified in the data frame.

In Aspect 3, the subject matter of Aspect 2 optionally includes logic circuitry configured to include sign extension data in the padding data when selected according to the mode input.

In Aspect 4, the subject matter of one or both of Aspects 2 and 3 optionally include a multi-channel ADC circuit that produces a data frame containing a digital value for each channel, and the logic circuitry is configured to, when selected according to the mode input, shift the bits of each data frame starting with the padding data first followed by the digital value of the data frame starting with the most significant bit of the digital value.

In Aspect 5, the subject matter of Aspect 4 optionally includes logic circuitry configured to include sign extension data in the padding data when selected according to the mode input.

In Aspect 6, the subject matter of one or any combination of Aspects 1-5 optionally includes logic circuitry configured to, when selected according to the mode input, shift out the bits of the digital value in a data frame that includes the bits of the digital value starting with the least significant bit of the digital value followed by padding data.

In Aspect 7, the subject matter of Aspect 6 optionally includes logic circuitry configured to include sign extension data in the padding data when selected according to the mode input.

In Aspect 8, the subject matter of one or both of Aspects 6 and 7 optionally includes a multi-channel ADC circuit that produces a data frame containing a digital value for each channel, and the logic circuitry is configured to, when selected according to the mode input, shift the bits of each data frame starting with the bits of the digital value first starting with the least significant bit of the digital value followed by the padding data.

In Aspect 9, the subject matter of Aspect 8 optionally includes logic circuitry configured to include sign extension data in the padding data when selected according to the mode input.

In Aspect 10, the subject matter of one or any combination of Aspects 1-9 optionally includes logic circuitry configured to, when selected according to the mode input, shift the bits of the digital value in a data frame that includes padding data first followed by the bits of the digital value followed by cyclic redundancy code (CRC) bits, wherein the CRC bits are right justified in the data frame.

In Aspect 11, the subject matter of Aspect 10 optionally includes a multiple channel ADC circuit configured to produce a digital value for each channel, and the logic circuitry is configured to, when selected according to the mode input, shift the bits of the digital values of the multiple channels in the data frame, wherein the bits of the data value of each channel is included in the data frame as a whole number of octets starting with the padding data first followed by the digital value, wherein the CRC bits are calculated over the digital values of the multiple channels and are right justified in the data frame.

In Aspect 12, the subject matter of one or any combination of Aspects 1-11 optionally includes a microcontroller including a serial interface coupled to the serial output of the ADC circuit, and a direct memory access (DMA) controller configured to transfer digital values received via the serial interface to memory of the microcontroller. The subject matter further includes logic circuitry configured to set the order of the bits shifted out the serial output in a data frame according to a data frame format of the microcontroller serial interface.

Aspect 13 includes subject matter (such as a method of processing an analog signal) or can optionally be combined with one or any combination of Aspects 1-12 to include such subject matter, comprising producing a digital value from the analog signal using an analog-to-digital converter (ADC) circuit, shifting bits of the digital value out a serial output of the ADC circuit, and setting, according to a mode input of the ADC circuit, an order that the bits of the digital value are shifted out the serial output of the ADC circuit.

In Aspect 14, the subject matter of Aspect 13 optionally includes shifting the bits of the digital value in a data frame in an order that includes padding data first followed by the bits of the digital value starting with the most significant bit of the digital value when selected according to the mode input of the ADC circuit.

In Aspect 15, the subject matter of Aspect 14 optionally includes shifting sign extension data as the padding data when selected according to the mode input of the ADC circuit.

In Aspect 16, the subject matter of one or both of Aspects 14 and 15 optionally includes producing multiple digital values from multiple analog signals using multiple channels of the ADC circuit, including the multiple digital values in respective multiple data frames shifted out the serial output of the ADC circuit, and shifting the bits of each data frame starting with the padding data first followed by the digital value of the data frame starting with the most significant bit of the digital value when selected according to the mode input of the ADC circuit.

In Aspect 17, the subject matter of one or any combination of Aspects 13-16 optionally includes shifting the bits of the digital value in a data frame in an order that includes shifting out the bits of the digital value first, starting with the least significant bit of the digital value, followed by padding data when selected according to the mode input of the ADC circuit.

In Aspect 18, the subject matter of Aspect 17 optionally includes shifting sign extension data as the padding data when selected according to the mode input of the ADC circuit.

In Aspect 19, the subject matter of one or any combination of Aspects 17-18 optionally includes producing multiple digital values from the same analog signal or multiple analog signals using multiple channels of the ADC circuit, including the multiple digital values in respective multiple data frames shifted out the serial output of the ADC circuit, and shifting the bits of each data frame starting with the bits of the digital value first starting with the least significant bit of the digital value followed by the padding data when selected according to the mode input of the ADC circuit.

Aspect 20 can include subject matter (such as a data acquisition system) comprising an analog-to-digital converter (ADC) circuit configured to produce a digital value from an analog input signal, and a microcontroller. The ADC circuit includes a signal input, a mode input, a serial output, and logic circuitry. The logic circuitry is configured to shift bits of the digital value out the serial output and change an order of the bits shifted out the serial output according to the mode input. The microcontroller includes a serial interface coupled to the serial output of the ADC circuit, and a control output coupled to the mode input of the ABC circuit, wherein the microcontroller is configured to select the order of bits of the digital value shifted out the serial output of the ADC circuit using the control output.

In Aspect 21, the subject matter of Aspect 20 optionally includes a microcontroller configured to select shifting the bits of the digital value in a data frame that includes padding data first followed by the bits of the digital value starting with the most significant bit of the digital value when the number of bits in the digital value does not match a frame size of the microcontroller.

In Aspect 22, the subject matter of one or both of Aspects 20 and 21 optionally includes a microcontroller is configured to select shifting out the bits of the digital value in a data frame that includes the bits of the digital value starting with the least significant bit of the digital value followed by padding data when the number of bits in the digital value does not match a frame size of the microcontroller.

These non-limiting Aspects can be combined in any permutation or combination. The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used; as is common in patent documents, to include one or more than one, independent of any other instances or usages of "at least one" or "one or more." In this document; the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects. Method examples described herein can be machine or computer-implemented at least in part.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 CFR. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. A data acquisition device, the device comprising:
an analog-to-digital converter (ADC) circuit configured to produce a digital value from an analog input signal, the ADC circuit including:
a signal input; a mode input; a serial output; and
logic circuitry configured to:
shift bits of the digital value out the serial output;
change an order of the bits shifted out the serial output according to the mode input; and
when selected according to the mode input, shift the bits of the digital value in a data frame that includes padding data first followed by the bits of the digital value starting with the most significant bit of the digital value, wherein the digital value is right justified in the data frame.

2. The device of claim 1, wherein the logic circuitry is configured to include sign extension data in the padding data when selected according to the mode input.

3. The device of claim 1, wherein the ADC circuit is a multi-channel ADC circuit that produces a data frame containing a digital value for each channel, and the logic circuitry is configured to, when selected according to the mode input, shift the bits of each data frame starting with the padding data first followed by the digital value of the data frame starting with the most significant bit of the digital value.

4. The device of claim 3, wherein the logic circuitry is configured to include sign extension data in the padding data when selected according to the mode input.

5. The device of claim 1, wherein the logic circuitry is configured to, when selected according to the mode input, change to shifting out the bits of the digital value in a data frame that includes the bits of the digital value starting with the least significant bit of the digital value followed by the padding data.

6. The device of claim 5, wherein the logic circuitry is configured to include sign extension data in the padding data when selected according to the mode input.

7. The device of claim 5, wherein the ADC circuit is a multi-channel ADC circuit that produces a data frame containing a digital value for each channel, and the logic circuitry is configured to, when selected according to the mode input, shift the bits of each data frame starting with the bits of the digital value first starting with the least significant bit of the digital value followed by the padding data.

8. The device of claim 7, wherein the logic circuitry is configured to include sign extension data in the padding data when selected according to the mode input.

9. The device of claim 1, wherein the logic circuitry is configured to, when selected according to the mode input, shift the bits of the digital value in a data frame that includes the padding data first followed by the bits of the digital value followed by cyclic redundancy code (CRC) bits, wherein the CRC bits are right justified in the data frame.

10. The device of claim 9, wherein the ADC circuit is a multiple channel ADC circuit configured to produce a digital value for each channel, and the logic circuitry is configured to, when selected according to the mode input, shift the bits of the digital values of the multiple channels in the data frame, wherein the bits of the data value of each channel is included in the data frame as a whole number of octets starting with the padding data first followed by the digital value, wherein the CRC bits are calculated over the digital values of the multiple channels and are right justified in the data frame.

11. The device of claim 1, including:
a microcontroller including:
a serial interface coupled to the serial output of the ADC circuit; and
a direct memory access (DMA) controller configured to transfer digital values received via the serial interface to memory of the microcontroller; and
wherein the logic circuitry is configured to set the order of the bits shifted out the serial output in a data frame according to a data frame format of the microcontroller serial interface.

12. A method of processing an analog signal, the method comprising:
producing a digital value from the analog signal using an analog-to-digital converter (ADC) circuit;
shifting bits of the digital value out a serial output of the ADC circuit; and
setting, according to a mode input of the ADC circuit, an order that the bits of the digital value are shifted out the serial output of the ADC circuit, including shifting the bits of the digital value in a data frame in an order that includes padding data first followed by the bits of the digital value starting with the most significant bit of the digital value when selected according to the mode input of the ADC circuit.

13. The method of claim 12, including shifting sign extension data as the padding data when selected according to the mode input of the ADC circuit.

14. The method of claim 12, including:
producing multiple digital values from multiple analog signals using multiple channels of the ADC circuit;
including the multiple digital values in respective multiple data frames shifted out the serial output of the ADC circuit; and
shifting the bits of each data frame starting with the padding data first followed by the digital value of the data frame starting with the most significant bit of the digital value when selected according to the mode input of the ADC circuit.

15. The method of claim 12, including shifting the bits of the digital value in a data frame in an order that includes shifting out the bits of the digital value first, starting with the least significant bit of the digital value, followed by the padding data when selected according to the mode input of the ADC circuit.

16. The method of claim 15, including shifting sign extension data as the padding data when selected according to the mode input of the ADC circuit.

17. The method of claim 15 including:
producing multiple digital values from the same analog signal or multiple analog signals using multiple channels of the ADC circuit;
including the multiple digital values in respective multiple data frames shifted out the serial output of the ADC circuit; and
shifting the bits of each data frame starting with the bits of the digital value first starting with the least significant bit of the digital value followed by the padding data when selected according to the mode input of the ADC circuit.

18. A data acquisition system, the system including
an analog-to-digital converter (ADC) circuit configured to produce a digital value from an analog input signal, the ADC circuit including:
a signal input; a mode input; a serial output; and
logic circuitry configured to:
shift bits of the digital value out the serial output; and
change an order of the bits shifted out the serial output according to the mode input; and
a microcontroller, wherein the microcontroller includes:
a serial interface coupled to the serial output of the ADC circuit; and
a control output coupled to the mode input of the ADC circuit, wherein the microcontroller is configured to select the order of bits of the digital value shifted out the serial output of the ADC circuit using the control output.

19. The system of claim 18, wherein the microcontroller is configured to select shifting the bits of the digital value in a data frame that includes padding data first followed by the bits of the digital value starting with the most significant bit of the digital value when the number of bits in the digital value does not match a frame size of the microcontroller.

20. The system of claim 18, wherein the microcontroller is configured to select shifting out the bits of the digital value in a data frame that includes the bits of the digital value starting with the least significant bit of the digital value followed by padding data when the number of bits in the digital value does not match a frame size of the microcontroller.

* * * * *

UNITED STATES PATENT AND TRADEMARK OFFICE
CERTIFICATE OF CORRECTION

PATENT NO. : 11,515,882 B2  
APPLICATION NO. : 17/127211  
DATED : November 29, 2022  
INVENTOR(S) : Usach Merino et al.

Page 1 of 1

It is certified that error appears in the above-identified patent and that said Letters Patent is hereby corrected as shown below:

In the Claims

In Column 11, Line 54, in Claim 1, after "input;", insert a linebreak

In Column 11, Line 54, in Claim 1, after "input;", insert a linebreak

In Column 14, Line 6, in Claim 18, delete "including", insert --comprising:--

In Column 14, Line 9, in Claim 18, after "input;", insert a linebreak

In Column 14, Line 9, in Claim 18, after "input;", insert a linebreak

Signed and Sealed this  
Twelfth Day of September, 2023

Katherine Kelly Vidal  
*Director of the United States Patent and Trademark Office*